United States Patent
Schumacher et al.

(10) Patent No.: US 7,380,232 B1
(45) Date of Patent: May 27, 2008

(54) METHOD AND APPARATUS FOR DESIGNING A SYSTEM FOR IMPLEMENTATION IN A PROGRAMMABLE LOGIC DEVICE

(75) Inventors: Paul R. Schumacher, Berthoud, CO (US); Jorn W. Janneck, San Jose, CA (US); David B. Parlour, Fox Chapel, PA (US)

(73) Assignee: Xilinx, Inc., San Jose, CA (US)

( * ) Notice: Subject to any disclaimer, the term of this patent is extended or adjusted under 35 U.S.C. 154(b) by 287 days.

(21) Appl. No.: 11/373,709

(22) Filed: Mar. 10, 2006

(51) Int. Cl.
*G06F 17/50* (2006.01)
(52) U.S. Cl. .............................. 716/18; 716/16; 716/17
(58) Field of Classification Search .................. 716/18, 716/17, 16
See application file for complete search history.

(56) References Cited

U.S. PATENT DOCUMENTS

| | | | |
|---|---|---|---|
| 4,758,953 A | 7/1988 | Morita et al. | |
| 5,095,441 A | 3/1992 | Hopper et al. | |
| 5,247,651 A * | 9/1993 | Clarisse | 703/13 |
| 5,249,133 A | 9/1993 | Batra | |
| 5,452,239 A | 9/1995 | Dai et al. | |
| 5,553,272 A | 9/1996 | Ranganathan et al. | |
| 5,870,588 A | 2/1999 | Rompaey et al. | |
| 5,896,301 A | 4/1999 | Barrientos | |
| 5,898,595 A | 4/1999 | Bair et al. | |
| 5,910,899 A | 6/1999 | Barrientos | |
| 6,011,911 A | 1/2000 | Ho et al. | |
| 6,023,567 A | 2/2000 | Osier et al. | |
| 6,078,736 A | 6/2000 | Guccione | |
| 6,131,080 A | 10/2000 | Raimi et al. | |
| 6,135,647 A | 10/2000 | Balakrishnan et al. | |
| 6,154,719 A | 11/2000 | Saitoh et al. | |
| 6,230,299 B1 | 5/2001 | McSherry et al. | |
| 6,272,671 B1 | 8/2001 | Fakhry | |
| 6,298,472 B1 * | 10/2001 | Phillips et al. | 716/18 |
| 6,530,071 B1 | 3/2003 | Guccione et al. | |
| 6,530,072 B1 | 3/2003 | Hagerman et al. | |
| 6,546,532 B1 | 4/2003 | Kerzman et al. | |
| 6,557,156 B1 | 4/2003 | Guccione | |
| 6,622,291 B1 | 9/2003 | Ginetti | |
| 6,678,646 B1 | 1/2004 | McConnell et al. | |
| 6,725,441 B1 | 4/2004 | Keller et al. | |
| 6,756,922 B2 | 6/2004 | Ossia | |

(Continued)

OTHER PUBLICATIONS

J. Eker and J.W. Janneck; "CAL Language Report—Specification of the CAL actor Language"; Version 1.0, document edition 1; ERL Technical Memo UCB/ERL, M03/48; University of California at Berkeley; Dec. 1, 2003; pp. 1-112.

(Continued)

*Primary Examiner*—Sun James Lin
(74) *Attorney, Agent, or Firm*—Robert Brush

(57) ABSTRACT

Method and apparatus for designing a system for implementation in a programmable logic device (PLD) is described. In one example, a program language description of the system is captured. The program language description includes control code for configuring actor elements with functions to perform tasks in response to input data. A hardware implementation is generated for the PLD from the program language description by mapping the control code to decision logic, the functions to partial configuration streams, and the actor elements to reconfigurable slots.

20 Claims, 5 Drawing Sheets

U.S. PATENT DOCUMENTS

| | | | |
|---|---|---|---|
| 6,829,753 | B2 | 12/2004 | Lee et al. |
| 6,865,726 | B1 | 3/2005 | Igusa et al. |
| 6,868,017 | B2 | 3/2005 | Ikeda |
| 6,868,532 | B2 | 3/2005 | Nadeau-Dostie et al. |
| 6,922,665 | B1 | 7/2005 | Guccione et al. |
| 6,988,238 | B1 | 1/2006 | Kovacevic et al. |
| 6,993,733 | B2 | 1/2006 | Murphy |
| 7,003,751 | B1 | 2/2006 | Stroomer et al. |
| 7,006,960 | B2 | 2/2006 | Schaumont et al. |
| 7,024,654 | B2 | 4/2006 | Bersch et al. |
| 7,062,418 | B2 | 6/2006 | Lee et al. |
| 7,073,152 | B2 | 7/2006 | Keller et al. |
| 7,139,955 | B2 | 11/2006 | Rohrbaugh et al. |
| 7,143,367 | B2 | 11/2006 | Eng |
| 7,146,300 | B2 | 12/2006 | Zammit et al. |
| 7,146,583 | B1 | 12/2006 | Sun et al. |
| 7,194,705 | B1 * | 3/2007 | Deepak et al. .............. 716/3 |
| 7,194,714 | B2 | 3/2007 | Kartschoke et al. |
| 7,203,632 | B2 | 4/2007 | Milne et al. |
| 7,216,321 | B2 | 5/2007 | Murphy et al. |
| 2001/0007139 | A1 | 7/2001 | Murray |
| 2002/0049958 | A1 | 4/2002 | Shimazawa |
| 2002/0059054 | A1 | 5/2002 | Bade et al. |
| 2003/0084416 | A1 | 5/2003 | Dai et al. |
| 2003/0216901 | A1 | 11/2003 | Schaumont et al. |
| 2004/0015613 | A1 | 1/2004 | Ikeda |
| 2004/0141354 | A1 | 7/2004 | Carnahan |
| 2005/0063481 | A1 | 3/2005 | Fechtel et al. |
| 2005/0188339 | A1 | 8/2005 | Anderson |
| 2005/0210383 | A1 | 9/2005 | Cucerzan et al. |
| 2005/0268258 | A1 | 12/2005 | Decker |
| 2005/0268260 | A1 | 12/2005 | Colley |
| 2006/0059134 | A1 | 3/2006 | Palmon et al. |
| 2006/0090146 | A1 | 4/2006 | LeBritton et al. |
| 2006/0136193 | A1 | 6/2006 | Lux-Pogodalla et al. |
| 2006/0200788 | A1 | 9/2006 | Nation et al. |

OTHER PUBLICATIONS

Massimo Ravasi et al.; "High-Level Algorithmic Complexity Evaluation for System Design"; Journal of Systems Architecture; Feb. 2003; Copyright 2003 Elsevier Science B.V.; available at www.ComputerScienceWeb.com; pp. 403-427.

Xilinx, Inc.; "Two Flows for Partial Reconfiguration: Module Based or Difference Based"; XAPP290 (v1.2); Sep. 9, 2004; available from www.xilinx.com; pp. 1-28.

Xilinx, Inc.; U.S. Appl. No. 11/373,745 by Janneck et al. filed Mar. 10, 2006.

Xilinx, Inc.; U.S. Appl. No. 11/373,744 by Janneck et al. filed Mar. 10, 2006.

Xilinx, Inc.; U.S. Appl. No. 11/243,679 by Janneck et al. filed Oct. 4, 2005.

Xilinx, Inc.; U.S. Appl. No. 11/243,732 by Vogenthaler filed Oct. 4, 2005.

U.S. Appl. No. 11/076,797, filed Mar. 10, 2005, Schumacher et al.

U.S. Appl. No. 11/083,667, filed Mar. 18, 2005, Milne et al.

Gilleland, Michael, "Levenshtein Distance, in Three Flavors," pp. 1-12, available from ttp://www.merriampark.com/ld.htm, No Date.

Hsu, Chia-Jui et al.; "DIF: An Interchange Format For Dataflow-based Design Tools," International Workshop on Systems, Architectures, Modeling and Simulation, Jul. 2004, pp. 1-10, available from Department of Electrical and Computer Engineering and Institute for Advanced Computer Studies, University of Maryland, College Park, 20742.

Lee, Edward A. et al.; "Dataflow Process Networks," Proceedings of the IEEE, May 1995, pp. 773-799, vol. 83, No. 5, available from IEEE, 3 Park Avenue, 17th Floor, New York, NY 10016-5997.

Bhattacharyya, Shuvra Shikhar, "Compiling Dataflow Programs For Digital Signal Processing," Jul. 1994, pp. 1-255, available from Department of Electrical Engineering and Computer Sciences, University of California at Berkeley, Berkeley, CA 94720.

Tanaka, Eiichi et al., "High Speed String Edit Methods Using Hierarchical Files and Hashing Technique," Nov. 14-17, pp. 334-336, 1988 Pattern Recognition; 9th International Conference; vol. 1; Copyright 1988 IEEE.

Navarro, Gonzalo, "Pattern Matching," Department of Computer Science, University of Chile, Mar. 7, 2005, pp. 1-24, available from the Internet at http://www.ciw.cl/publicaciones/jstat04.pdf.

* cited by examiner

METHOD AND APPARATUS FOR DESIGNING A SYSTEM FOR IMPLEMENTATION IN A PROGRAMMABLE LOGIC DEVICE

FIELD OF THE INVENTION

One or more aspects of the present invention relate generally to electronic circuit design and analysis systems and, more particularly, to a method and apparatus for designing a system for implementation in a programmable logic device (PLD).

BACKGROUND OF THE INVENTION

Modern integrated circuits are designed using programmed computers. Such computers are conventionally programmed with Electronic Design Automation (EDA) and Electronic Computer-Aided Design (ECAD) tools (generally referred to as EDA tools). EDA tools process an abstract representation of a circuit design into a physical representation of the circuit design that can be implemented using integrated circuitry. For example, a circuit design may be specified by a designer using a hardware description language (HDL), such as the very high speed integrated circuit hardware description language (VHDL) or VERILOG.

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. An FPGA may also include various dedicated logic circuits, such as memories, digital clock managers (DCMs), and input/output (I/O) transceivers. Notably, an FPGA may include one or more embedded processors. The programmable logic of an FPGA (e.g., CLBs, IOBs, and interconnect structure) is typically programmed by loading a stream of configuration data (known as a bitstream) into internal configuration memory cells. The states of the configuration memory cells define how the CLBs, IOBs, interconnect structure, and other programmable logic are configured. Some FPGAs include support for run-time partial reconfiguration, which provides the ability to alter the behavior of portions of a circuit configured in an active FPGA. Partial reconfiguration is useful in systems that must support a wide range of optional behavior, only a subset of which is operational at any point in time.

Typically, circuits are designed for implementation in an FPGA using an HDL. However, present HDLs are only capable of describing a circuit that is static, that is, a circuit whose function is fully described at design time. Thus, in present design flows, it is very challenging to model dynamic circuits that use run-time reconfiguration. Accordingly, there exists a need in the art for modeling, analysis, and implementation of a circuit designed to use run-time reconfiguration capabilities of a PLD.

SUMMARY OF THE INVENTION

Method and apparatus for designing a system for implementation in a programmable logic device (PLD) is described. In one embodiment, a program language description of the system is captured. The program language description includes control code for configuring actor elements with functions to perform tasks in response to input data. A hardware implementation is generated for the PLD from the program language description by mapping the control code to decision logic, the functions to partial configuration streams, and the actor elements to reconfigurable slots.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for designing a system for implementation in a programmable logic device (PLD) is described. A high-level programming language model is provided for describing systems that employ run-time reconfiguration. The high-level model is used to capture a complete description of a system, including all alternative behaviors that can be selected at runtime, and the control mechanisms for selecting the appropriate behaviors. A circuit description generated in this manner is a homogenous, self-contained model of an entire reconfigurable system. A hardware implementation for a PLD is generated automatically from the circuit description. Since the model is complete, implementations for all alternative implementations selectable at runtime are generated, along with an implementation of the static portion of the design. The static portion includes the control logic that manages multiple partial configurations for the alternative implementations and controls the loading and unloading of these partial configurations at runtime. An aspect of the invention is described with respect to a field programmable gate array (FPGA). It is to be understood that the invention may be used with other types of PLDs that are capable of runtime reconfiguration.

Figure 1:
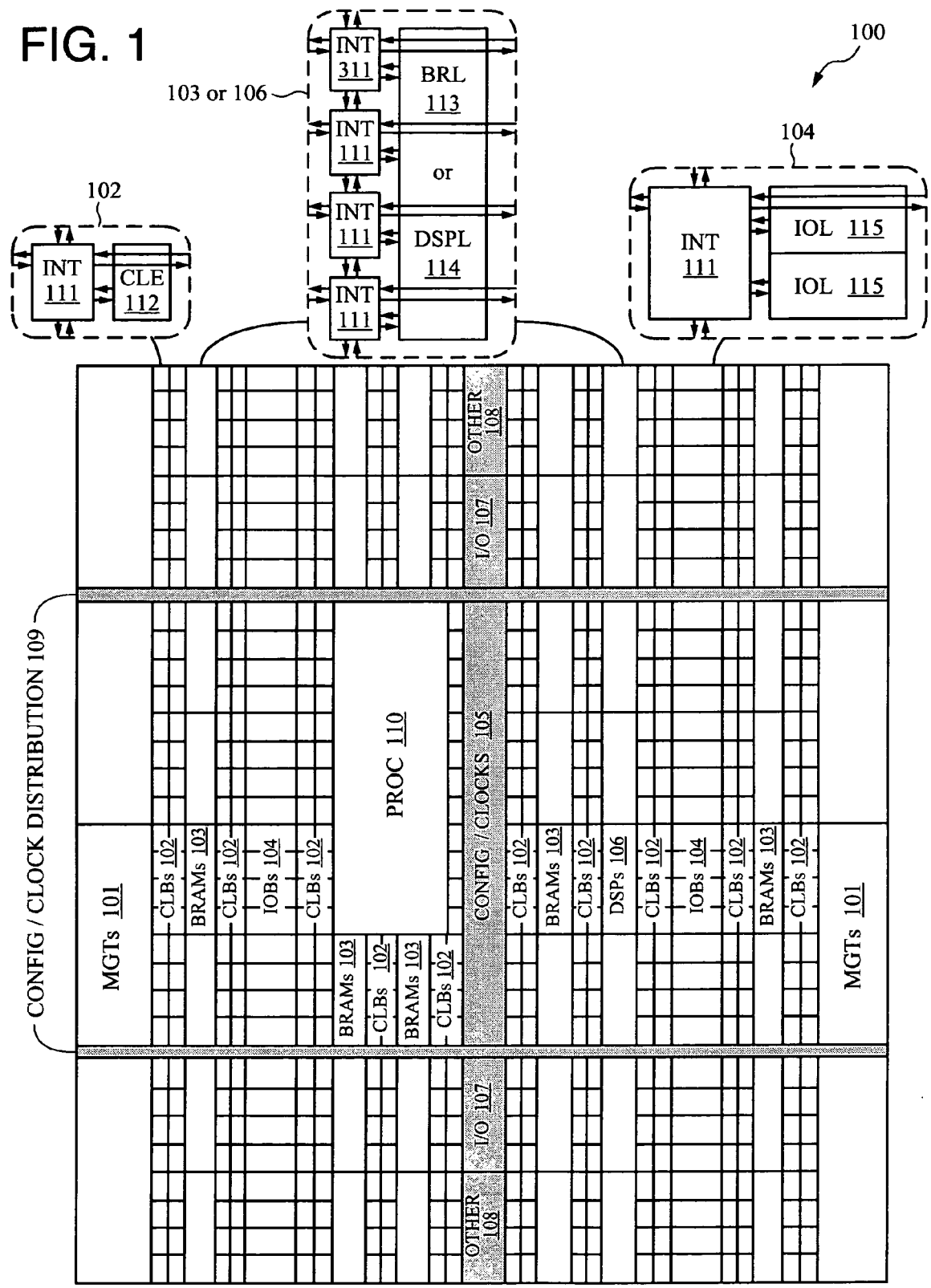
FIG. 1 illustrates an exemplary embodiment of an FPGA architecture.

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 110 is coupled to the programmable logic of the FPGA in a well known manner.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Configuration information for the programmable logic is stored in configuration memory (not shown). The configuration logic 105 provides an interface to, and loads configuration data to, the configuration memory. A stream of configuration data ("configuration bitstream") may be coupled to the configuration logic 105, which in turn loads the configuration memory. Notably, the configuration logic 105 is configured to support the loading of partial configuration bitstreams while the FPGA is active. This allows for reconfiguration of portions of the FPGA during runtime. The configuration and reconfiguration process for the FPGA is well known in the art.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
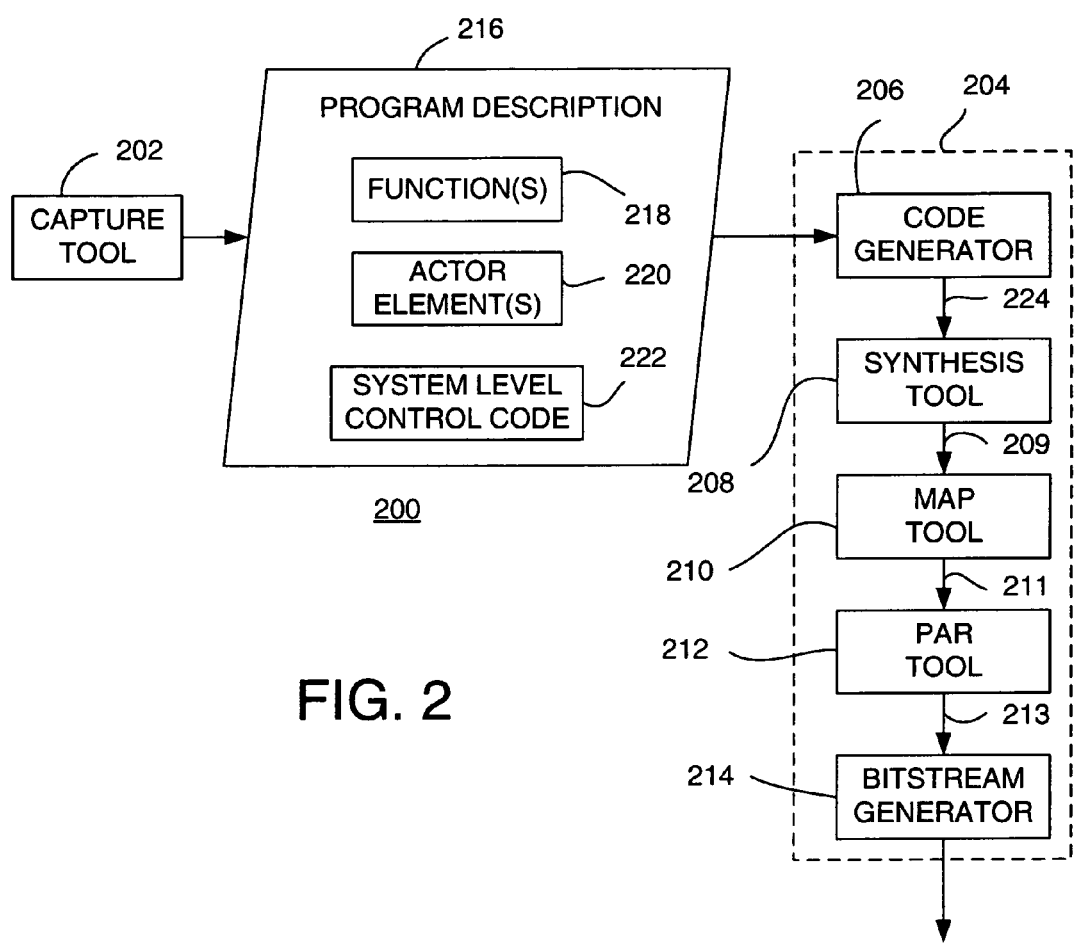
FIG. 2 is a block diagram depicting an exemplary embodiment of a system for designing a circuit for implementation in a PLD in accordance with one or more aspects of the invention.

FIG. 2 is a block diagram depicting an exemplary embodiment of a system 200 for designing a circuit for implementation in a PLD in accordance with one or more aspects of the invention. The system 200 includes a capture tool 202 and an implementation tool 204. The implementation tool 204 includes a code generator 206, a synthesis tool 208, a map tool 210, a place and route (PAR) tool 212, and a bitstream generator 214. The system 200 is configured to capture a circuit design from user input and produce implementation data for a target PLD, such as an FPGA. An exemplary hardware implementation is described below with respect to FIG. 5.

In particular, the capture tool 202 generates a program language description 216 of a system from user input. The capture tool 202 may be a graphical user interface (GUI) or other type of interface known in the art in which a designer may interact to specify the program language description 216. The program language description 216 includes programming constructs that define a particular system, which may be hardware or a combination of hardware and software. The program language description 216 may be specified using any language that supports run-time behavior modification. Such languages include sequential programming languages, such as C or C++, or concurrent programming languages, such as the CAL actor programming language or SystemC. Notably, such high-level programming languages include constructs that allow for changing the behavior of functions or procedures at runtime (i.e., dynamic function reassignment). For purposes of clarity by example, the program language description 216 is described below as being specified using the CAL actor language. A description is given in the "CAL language Report", by Eker and Janneck, ERL technical Memo UCB/ERL M03/48, University of California at Berkeley, Dec. 1, 2003, which is herein incorporated by reference.

In particular, the program language description 216 includes units referred to as actors, which model the processes of a system. Actors communicate through ports and are opaque (i.e., their internal state is not visible outside the actor). The ports are unidirectional (input or output) and they communicate tokens, which are discrete units of data. Actors consume or produce discrete tokens as a result of action firings. The connections between actors, which model the communication channels of the system, represent a higher level of abstraction than simple wires. Channels can have memory, and it is possible for an actor to check the availability and value of tokens at its input ports.

Figure 3:
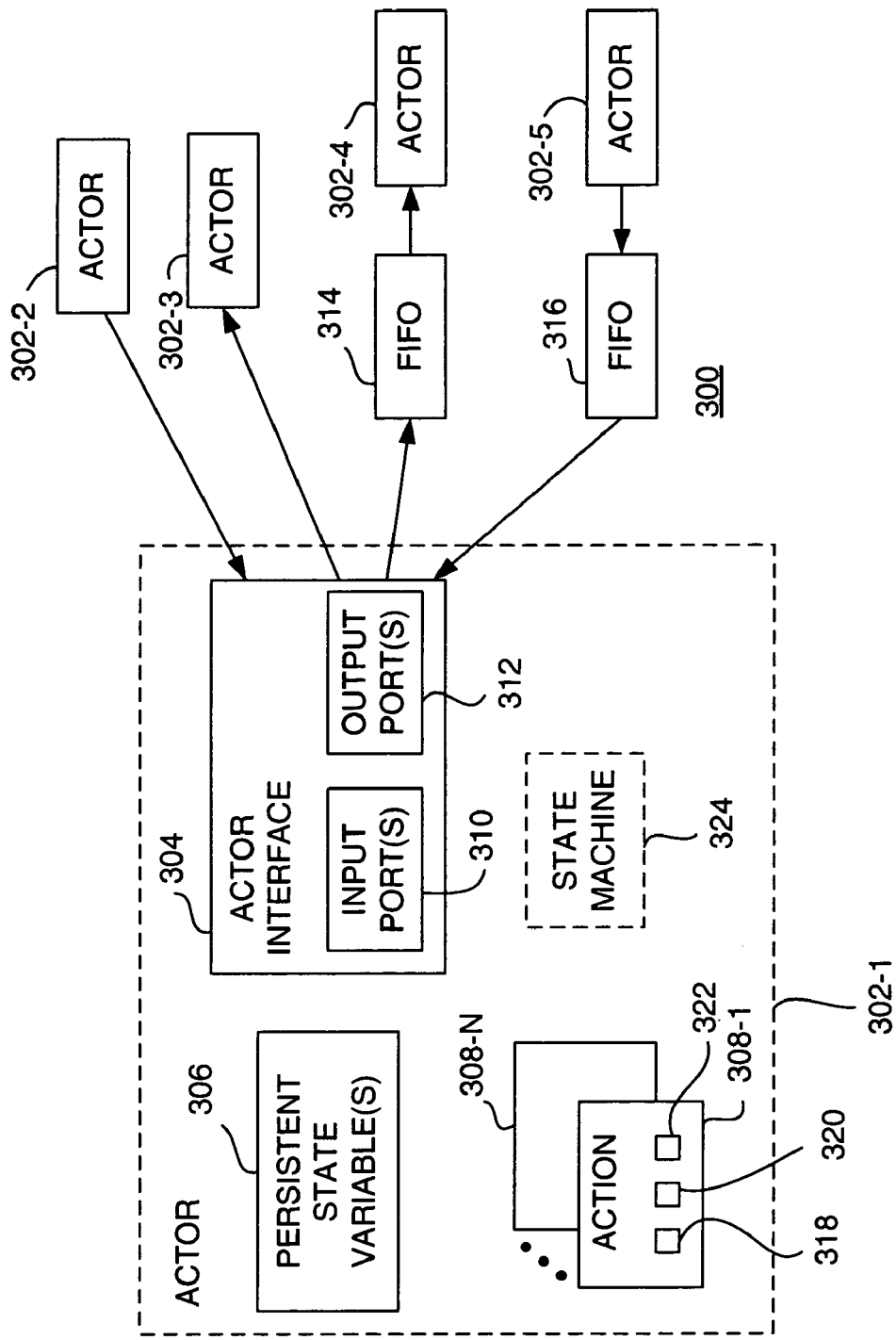
FIG. 3 is a block diagram depicting an exemplary representation a program defined in accordance with one or more aspects of the invention.

FIG. 3 is a block diagram depicting an exemplary representation a program 300 defined in accordance with one or more aspects of the invention. The program 300 illustratively includes actors 302-1 through 302-5. For clarity, only the actor 302-1 is shown in detail. It is to be understood that the actors 302-2 through 302-5 are similar to the actor 302-1. The actor 302-1 includes an actor interface 304, persistent variables 306, and actions 308-1 through 308-N (collectively referred to as actions 308), where N is an integer greater than zero. The actor interface 304 may include one or more input ports 310 and one or more output ports 312. In some cases, the actor interface 304 may include only the output ports 312. In some other cases, the actor interface 304 may include only the input ports 310. In the present example, the actor interface 304 may receive tokens directly from the actor 302-2 and provides tokens directly to the actor 302-3. The actor interface 304 provides tokens to the actor 302-4 through a first-in-first-out memory (FIFO) model 314, and receives tokens from the actor 302-5 through a FIFO model 316. In terms of physical implementation, the circuit that implements the actor 302-1 communicates with the circuits that implement the actors 302-2 and 302-3 synchronously and the circuits that implement the actors 302-4 and 302-5 asynchronously. The program 300 need not specify the storage mechanism of the communication channels. The programmer can assume that the channel depth is infinite. Automatic or manual analysis of the actor network may be used to determine the required channel depths for correct program operation.

The persistent variables 306 store the state of the actor 302-1. The values of the persistent variables 306 are readable and writeable by any of the actions 308. Notably, the persistent variables 306 have actor-scope in that they are accessible only from within the actor 302-1. In terms of actual physical implementation, the persistent variables 306 may be registers or multi-port memories with associated controls and multiplexing logic.

Each of the actions 308 is configured to read some number of tokens from various ones of the input ports 310 and write some number of tokens to various ones of the output ports 312. Alternatively, an action may be configured to just read tokens from input ports and produce no output tokens, or an action may be configured to just write tokens to output ports and receive no input tokens. The tokens at the input ports 310 may comprise data and/or functions to be executed. In any case, each of the actions 308 includes firing rule data 318 that dictates when the action may "fire" (i.e., execute its described operation). In one embodiment, an action only fires if the necessary input tokens are present at the input ports 310 ("default firing rule"). Alternatively, or in addition to the default firing rule, an action may fire based on one or more guard conditions that must be true for the action to fire. Guard conditions may be Boolean expressions that test any persistent state variable of the actor or input token.

Each of the actions 308 may also include one or more local variables 320. The value of the local variables 320 do not persist from firing to firing, but may be used to hold temporary or intermediate results during execution of a particular firing. Each of the actions 308 may include procedural instruction data 322. The procedural instruction data 322 includes a sequence of instructions that is executed during a firing. Notably, the simplest action merely copies from an input to an output and thus has no procedural instruction data 322. The procedural instruction data 322 may include various constructs, such as assignments, flow control (e.g., if/else, loops), and the like. The procedural instruction data 322 may also call functions.

Notably, each firing of an action is atomic. That is, no other action may read or write to any resource that is written to or read by an action whose firing is already underway (including the use of resources in guard conditions). Provided that the rule of atomicity is observed, multiple actions are permitted to execute concurrently. An action may implement state-machine like behavior using the procedural instruction data 322 by modifying persistent variables of the actor 302-1 and testing them in guard conditions. In one embodiment, the actor 302-1 may include a state machine declaration 324. The state machine declaration 324 declares a state machine in finite state machine (FSM) form by an initial state and any number of state transitions that accompany the firing of one or more of the actions 308. The source states for the transitions become additional requirements for the action firings that are logically ANDed with the other firing rules, described above. Another embodiment of program 300 is disclosed in commonly assigned, co-pending U.S. patent application Ser. No. 11/243,679, entitled "Method and Apparatus for Implementing a Program Language Description of a Circuit Design for an Integrated Circuit", by Jorn W. Janneck, et. al., filed Oct. 4, 2005, which is herein incorporated by reference.

Returning to FIG. 2, the program language description 216 includes one or more functions 218, each of which is configured to perform a particular task. In one embodiment, each of the functions 218 is a structure having at least one function body and at least one variable. For example, a function may be expressed by: E (E1, E2, . . . , En), where E1 is a function that can be performed, E2 is another function that can be performed (optional), and E3-En are variables. The variables may be used to store runtime statistics, as described below. The program language description 216 may several such functions: F (F1, F2, . . . , Fn), G (G1, G2, . . . , Gn), and so on.

The program language description 216 also includes one or more actors 220. Each of the actors 220 is configured to accept a function as an input token. That is, each of the actors 220 may be configured to perform a particular function by passing one of the functions 218 as an input token. For example, a simple actor that can be configured to perform a requested function can be expressed as follows:

actor Apply ( ) F, X==>Y:
action F: [f], X: [x]==>Y[f(x)] end
end

In the above example, the Apply( ) actor includes input ports denoted F and X, and an output port denoted Y. The actor also includes an action that will fire if tokens are available at the F and X input ports. The input port F is configured to receive tokens that are functions or structures. The input port X is configured to receive tokens that are data. When a function and data are present at the input ports, the sole action will fire, causing the function that was passed to the actor to be performed using the data that was passed to the actor as parametric input (i.e., f(x)). The result of the function is provided as a token on the output port Y.

As is apparent from the above example, the behavior of the actor is dynamically assigned during runtime. Such dynamic function assignment can be used to model reconfiguration of a circuit in a PLD while the PLD is active. In most cases, reconfiguration is performed on an intermittent basis. Thus, in another example, an actor includes a guard statement that provides priorities to continue performing the same configured function until (1) a new function is required by a system-level decision element; and (2) that function is made available to the actor. Such an actor may be expressed as follows:

```
actor ApplyWhenRequested (f0) F, X ==> Y:
    f := f0; //initial function
    readF: action F: [newF] ==>
        do
            f := newF;
        end
    apply: action X: [x] ==> Y: [f(x)] end
    priority readF > apply; end
end
```

In the above example, the ApplyWhenRequested actor includes two input ports F and X, an output port Y, a parameter f0, and a local variable f. As in the previous example, the input port F is configured to receive tokens that are functions or structures. The input port X is configured to receive tokens that are data. The output port Y provides output tokens. The parameter f0 references an initial function or structure. The actor includes two labeled actions, readF and apply. The actor is configured such that the readF action has a higher priority than the apply action. When a token is available at the input port X, but not at the input port F, the apply action is fired, causing the currently configured function to be performed using the data as parametric input. The currently configured function is assigned to the local variable f and is initially the parameter f0. When the actor receives a token at the input port F, the readF action is fired and the actor is configured with a new function. Note that, when the actor receives tokens at both the input ports F and X, the readF action is fired, since it has a higher priority than the apply action.

The program language description 216 also includes system-level control code 222. The system-level control code 222 provides a system-level decision element for configuring the actors 220 with the functions 218. For example, the system-level decision element may configure a given actor with a new function based on values of variable(s) associated with the currently configured function. As described above, a function may comprise a structure having one or more function bodies and one or more variables. The variables may be used to store various runtime statistics. For example, there may a variable that tracks the number of times the function has been performed. The system-level decision element may make decisions to reconfigure an actor based on the runtime statistics stored in these variables. The system-level control code 222 may also include a task allocation element, which allocates tasks to be performed among the actors 220. The system-level decision element may configure a given actor with a new function based on the tasks to be performed.

The code generator 206 is configured to receive the program language description 216. The code generator 206 processes the program language description 216 to produce a hardware description 224 (e.g., an HDL description). An exemplary process for translating a program language description to a HDL description is described in commonly-assign U.S. patent application Ser. No. 11/243,679, filed Oct. 4, 2005, which is incorporated by reference herein. The code generator 206 produces the hardware description 224 in accordance with a predefined hardware model. That is, the hardware description 224 is an instance of the hardware model. An exemplary hardware model is described below with respect to FIG. 5. The hardware model includes a static portion and a reconfigurable portion. The system-level control code 222 is mapped onto the static portion of the hardware model. The actors 220 are mapped onto reconfigurable slots of the hardware model. The code generator 206 produces a separate hardware implementation for each of the functions 218. As described below, a partial configuration stream is produced for each of these separate hardware implementations. The partial configuration streams are stored in a memory of the hardware model.

The synthesis tool 208 is configured to receive the hardware description 224. The synthesis tool 208 is configured to produce a logical network list (gate-level netlist) from HDL code. The synthesis tool 208 generates a gate-level netlist for the hardware model instance. For the reconfigurable portion, the synthesis tool 208 establishes a "black box" for each of the actors 220. The synthesis tool 208 also generates gate-level netlists for each of the functions 218. The synthesis tool 208 provides netlist data 209 to the map tool 210. The map tool 210 is configured to map a gate-level description of a design onto resources of the target FPGA. The map tool 210 maps the netlist for the hardware model instance, as well as the netlist for each of the functions. The map tool 210 provides mapped netlist data 211 to the PAR tool 212. The PAR tool 212 is configured to place mapped resources within the floorplan of the target FPGA and route connections between the resources using the programmable interconnect. The PAR tool 212 places and routes the mapped netlist for the hardware model instance, leaving room in the floorplan for the black boxes. The PAR tool 212 also places and routes each mapped netlist for the functions. The PAR tool 212 provides implementation data 213 to the bitstream generator 214. The bitstream generator 214 produces a partial configuration stream for each of the functions. The bitstream generator 214 also produces a full bitstream for the hardware model instance. Note that the full bitstream includes initial configurations for the actors.

Figure 5:
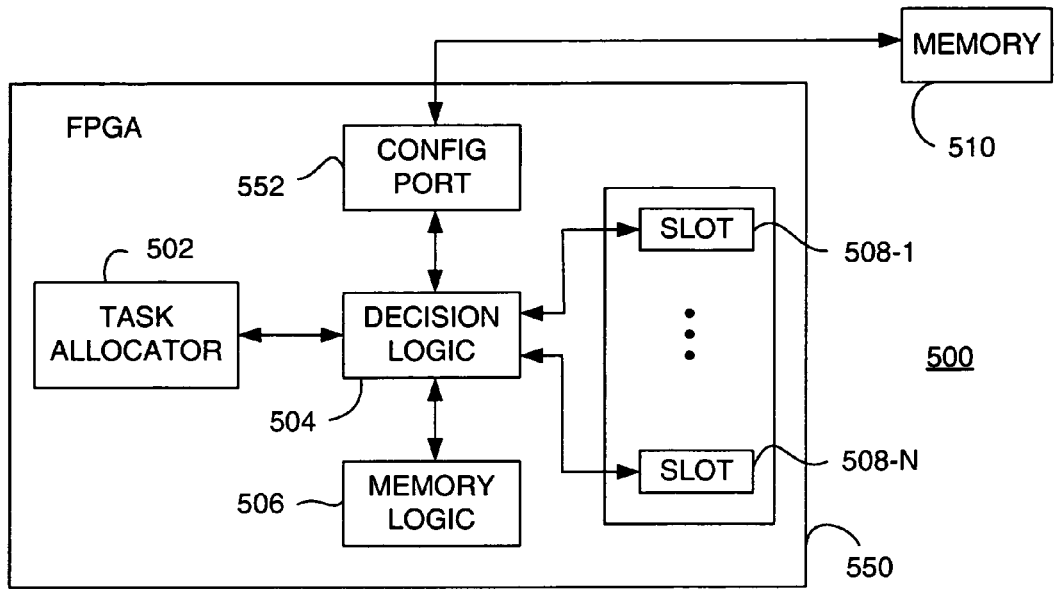
FIG. 5 is a block diagram depicting an exemplary embodiment of a model for the hardware implementation produced by the implementation tool of FIG. 2 in accordance with one or more aspects of the invention.

FIG. 5 is a block diagram depicting an exemplary embodiment of a model 500 for the hardware implementation produced by the implementation tool 204 in accordance with one or more aspects of the invention. The model 500 includes a task allocator 502, decision logic 504, memory logic 506, reconfigurable slots 508-1 through 508-N (collectively referred to as reconfigurable slots 508), and a memory 510. The model 500 is configured within an FPGA 550 having a configuration port 552.

With simultaneous reference to FIGS. 2 and 5, the implementation tool 204 is configured to map the program language description 216 onto the hardware model 500. The decision element of the system-level control code 222 is mapped onto the decision logic 504. The task allocation element of the system-level control code 222 is mapped onto the task allocator 502. Although the task allocator 502 and the decision logic 504 are shown as separate logic blocks, those skilled in the art will appreciate that the system level control code 222 may be mapped onto a single block that is a combination of the decision logic 504 and the task allocator 502. Each of the actors 220 is mapped onto one of the reconfigurable slots 508. The functions 220 are mapped to partial configuration streams stored in the memory 510. While the memory 510 is shown as being external to the FPGA 550, it is to be understood that the memory 510 alternatively be embedded in the FPGA 550.

In operation, the task allocator 502 is configured to send task requests to the decision logic 504. The decision logic 504 determines which of the reconfigurable slots 508 is to perform which task based on the task requests. As discussed above, each of the functions may have associated variables for runtime statistics. These variables are implemented in the memory logic 506. The decision logic 504 tracks the runtime statistics for the functions via the memory logic 506. For example, the runtime statistics stored in the memory logic 506 may include the number of times each of the reconfigurable slots 508 performs a function. Based on the runtime statistics stored in the memory logic 506, the tasks to be performed, or both of these data, the decision logic 504 selectively reconfigures the reconfigurable slots 508 using the partial configuration streams stored in the memory 510. For example, at a given time, there may be no reconfigurable slots 508 capable of performing a requested task. In this case, the decision logic 504, in response to the requested task, reconfigures one of the reconfigurable slots 508 using a partial configuration stream corresponding to the function capable of performing the requested task. The decision logic 504 may interface with the configuration port 552 to facilitate the partial reconfiguration.

In one embodiment, the task allocator 502 is implemented using a processor within the FPGA 550. The reconfigurable slots 508 comprise hardware blocks in communication with the processor. The decision logic 504 is configured to receive instructions from the processor implementing the task allocator 502 and determines which of the reconfigurable slots 508 is to perform which task based on the instructions. An exemplary system for communication between a processor and a set of hardware blocks in a PLD is described in commonly-assigned U.S. patent application Ser. No. 11/076,797, filed Mar. 10, 2005, entitled "Method and Apparatus for Communication Between a Processor and Hardware Blocks", by Paul R. Schumacher, et. al., which is incorporated by reference herein.

Figure 4:
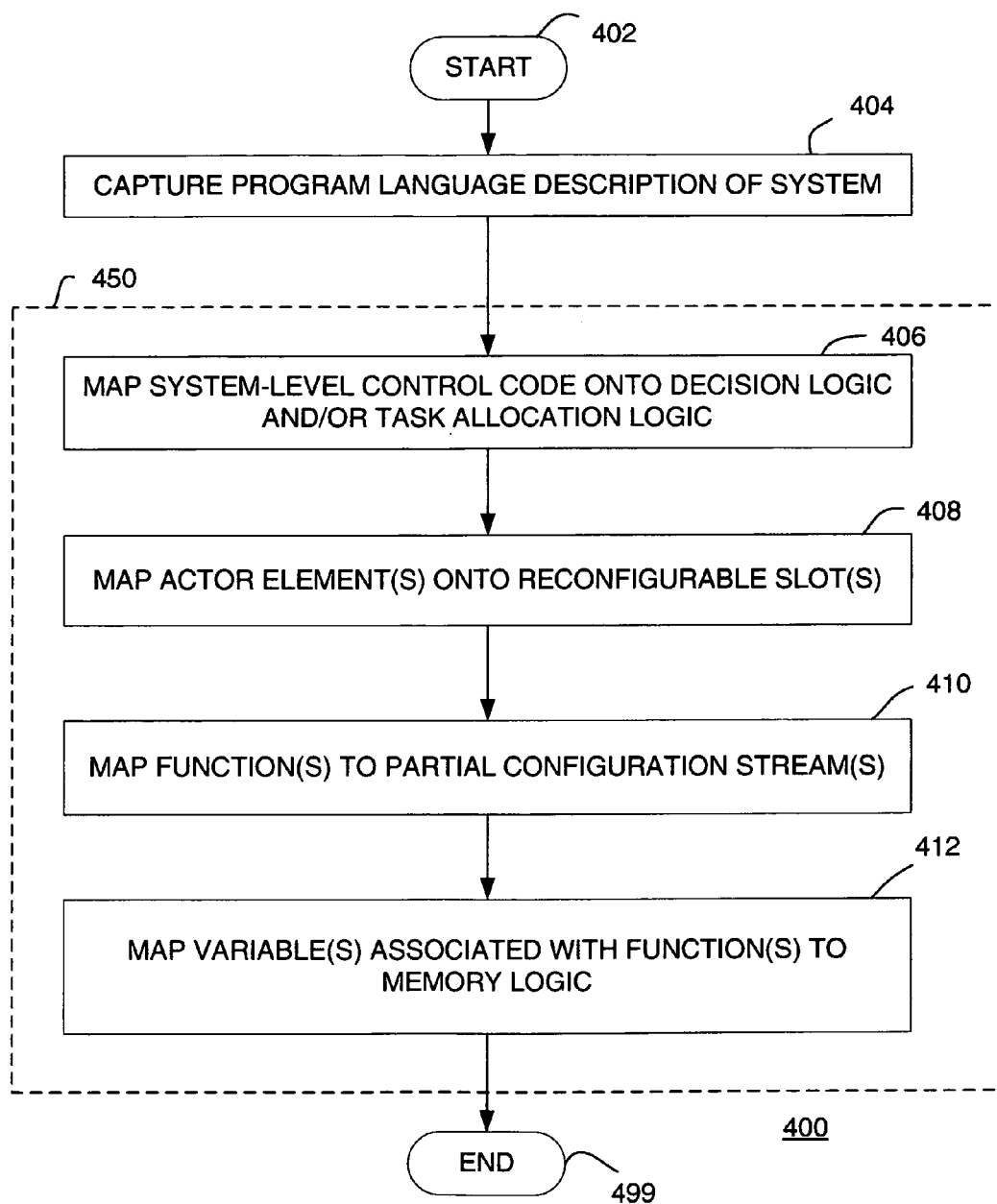
FIG. 4 is a flow diagram depicting an exemplary embodiment of a method of designing a system for implementation in a PLD in accordance with one or more aspects of the invention.

FIG. 4 is a flow diagram depicting an exemplary embodiment of a method 400 of designing a system for implementation in a PLD in accordance with one or more aspects of the invention. The method 400 begins at step 402. At step 404, a program language description of the system is captured. The program language description includes system-level control code for configuring actor elements with functions to perform tasks in response to input data. The method 400 proceeds from step 404 to method 450 for generating a hardware implementation for a target PLD from the program language description. The method 450 begins at step 406, where the system-level control code is mapped to decision logic and/or task allocation logic. At step 408, the actor elements are mapped to reconfigurable slots. At step 410, the functions are mapped to partial configuration streams. At step 412, variable(s) associated with the functions are mapped to memory logic. The method 400 ends at step 499.

Figure 6:
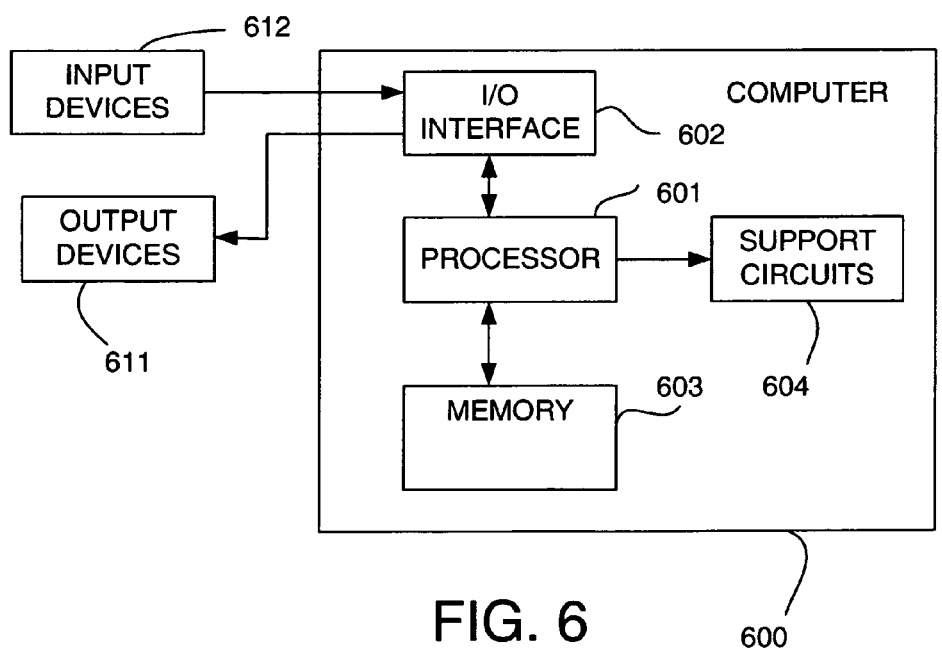
FIG. 6 is a block diagram depicting an exemplary embodiment of a computer suitable for implementing the processes and methods described herein.

FIG. 6 is a block diagram depicting an exemplary embodiment of a computer 600 suitable for implementing the processes and methods described herein. For example, the computer 600 may be used to implement the system 200 of FIG. 2 and the method 400 of FIG. 4. The computer 600 includes a processor 601, a memory 603, various support circuits 604, and an I/O interface 602. The processor 601 may be any type of microprocessor known in the art. The support circuits 604 for the processor 601 include conventional cache, power supplies, clock circuits, data registers, I/O interfaces, and the like. The I/O interface 602 may be directly coupled to the memory 603 or coupled through the processor 601. The I/O interface 602 may be coupled to various input devices 612 and output devices 611, such as a conventional keyboard, mouse, printer, display, and the like.

The memory 603 stores all or portions of one or more programs and/or data to implement the system 200 and method 400 described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 600 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 603. The memory 603 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of designing a system for implementation in a programmable logic device (PLD), comprising:

capturing a program language description of the system, the program language description including control code for configuring actor elements with functions to perform tasks in response to input data; and generating a hardware implementation for the PLD from the program language description by mapping the control code to decision logic, the functions to partial configuration streams, and the actor elements to reconfigurable slots.

2. The method of claim 1, wherein each of the functions comprises a structure having at least one function body and at least one variable.

3. The method of claim 2, wherein the step of generating comprises:
mapping the at least one variable of each of the functions to memory logic.

4. The method of claim 3, wherein the decision logic is configured to selectively reconfigure the reconfigurable slots using the partial configuration streams based on values of the at least one variable of each of the functions stored in the memory logic.

5. The method of claim 4, wherein the decision logic is further configured to selectively reconfigure the reconfigurable slots using the partial configuration streams based on the tasks.

6. The method of claim 1, wherein the step of generating comprises:
mapping the control code to task allocation logic.

7. The method of claim 6, wherein the task allocation logic is configured to request the decision logic to perform the tasks, and wherein the decision logic is configured to select specific ones of the reconfigurable slots to perform specific ones of the tasks.

8. Apparatus for designing a system for implementation in a programmable logic device (PLD), comprising:
a capture tool for capturing a program language description of the system, the program language description including control code for configuring actor elements with functions to perform tasks in response to input data; and
an implementation tool for generating a hardware implementation for the PLD from the program language description by mapping the control code to decision logic, the functions to partial configuration streams, and the actor elements to reconfigurable slots.

9. The apparatus of claim 8, wherein each of the functions comprises a structure having at least one function body and at least one variable.

10. The apparatus of claim 9, wherein the implementation tool is configured to map the at least one variable of each of the functions to memory logic.

11. The apparatus of claim 10, wherein the decision logic is configured to selectively reconfigure the reconfigurable slots using the partial configuration streams based on values of the at least one variable of each of the functions stored in the memory logic.

12. The apparatus of claim 11, wherein the decision logic is further configured to selectively reconfigure the reconfigurable slots using the partial configuration streams based on the tasks.

13. The apparatus of claim 8, wherein the implementation tool is configured to map the control code to task allocation logic.

14. The apparatus of claim 13, wherein the task allocation logic is configured to request the decision logic to perform the tasks, and wherein the decision logic is configured to select specific ones of the reconfigurable slots to perform specific ones of the tasks.

15. A computer readable medium having stored thereon software to be executed by a computer for designing a system for implementation in a programmable logic device (PLD), comprising:
code for capturing a program language description of the system, the program language description including control code for configuring actor elements with functions to perform tasks in response to input data; and
code for generating a hardware implementation for the PLD from the program language description by mapping the control code to decision logic, the functions to partial configuration streams, and the actor elements to reconfigurable slots.

16. The computer readable medium of claim 15, wherein each of the functions comprises a structure having at least one function body and at least one variable.

17. The computer readable medium of claim 16, wherein the code for generating comprises:
code for mapping the at least one variable of each of the functions to memory logic.

18. The computer readable medium of claim 17, wherein the decision logic is configured to selectively reconfigure the reconfigurable slots using the partial configuration streams based on values of the at least one variable of each of the functions stored in the memory logic.

19. The computer readable medium of claim 18, wherein the decision logic is further configured to selectively reconfigure the reconfigurable slots using the partial configuration streams based on the tasks.

20. The computer readable medium of claim 15, wherein the code for generating comprises:
mapping the control code to task allocation logic; and
wherein the task allocation logic is configured to request the decision logic to perform the tasks, and wherein the decision logic is configured to select specific ones of the reconfigurable slots to perform specific ones of the tasks.

* * * * *